United States Patent
Chen et al.

(10) Patent No.: US 8,208,330 B2
(45) Date of Patent: Jun. 26, 2012

(54) SENSE AMPLIFIER WITH SHIELDING CIRCUIT

(75) Inventors: Chung Kuang Chen, Taipei (TW);
Han-Sung Chen, Hsinchu (TW);
Chun-Hsiung Hung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 423 days.

(21) Appl. No.: 12/508,607

(22) Filed: Jul. 24, 2009

(65) Prior Publication Data

US 2011/0019456 A1     Jan. 27, 2011

(51) Int. Cl.
*G11C 7/02* (2006.01)
(52) U.S. Cl. ........................ 365/207; 365/208; 365/210.1
(58) Field of Classification Search ............... 365/207 O, 365/208 X, 209, 210.1 X, 210.11, 210.12, 365/210.13, 210.14, 207, 208, 210.1
See application file for complete search history.

(56) References Cited

U.S. PATENT DOCUMENTS

| | | | | |
|---|---|---|---|---|
| 5,761,123 A | * | 6/1998 | Kim et al. | 365/185.21 |
| 6,018,486 A | * | 1/2000 | Ferrant | 365/203 |
| 6,185,143 B1 | * | 2/2001 | Perner et al. | 365/171 |
| 6,937,495 B2 | * | 8/2005 | Scheuerlein | 365/105 |
| 7,151,688 B2 | * | 12/2006 | Williford et al. | 365/148 |

* cited by examiner

*Primary Examiner* — VanThu Nguyen
(74) *Attorney, Agent, or Firm* — Thomas|Kayden

(57) ABSTRACT

A sense amplifier comprises a sense node, a reference node, a memory input stage circuit, a reference input stage circuit, an output stage circuit, and a shielding circuit. The memory input stage circuit comprises first input node for maintaining a first sense voltage established by a cell current and establishes a second sense voltage on the sense node in response to the first sense voltage. The reference input stage circuit comprises an output node and a second input node, which is for maintaining a first reference voltage established by the reference current and establishes a second reference voltage on the reference node in response to the first reference voltage. The output stage circuit obtains a sense result in response to the second reference voltage and the second sense voltage. The first shielding circuit shields the output node from being interfered with the second reference voltage on the reference node.

19 Claims, 6 Drawing Sheets

SENSE AMPLIFIER WITH SHIELDING CIRCUIT

BACKGROUND OF THE INVENTION

1. Field of the Invention

The invention relates in general to a sense amplifier, and more particularly to a sense amplifier capable of reducing the feed through effect due to output signal sweeping on the reference node, which receives a reference voltage from a reference cell, of the sense amplifier.

2. Description of the Related Art

Non-volatile memory, such as flash memory, is widely used in various electronic products. Conventionally, when data stored in a memory cell of the flash is read, the memory cell is biased through a column decoder and a row decoder so that the memory cell generates a sensing current. For example, the sensing current is applied to a node for establishing a sense voltage. The sense voltage is compared with a reference voltage, which is established by a reference current provided by a reference cell, by a sense amplifier so that a sense result of the storage data can be determined.

Typically, the reference voltage is varied (or raised mostly) by the operation of the sense amplifier due to the feed through effect on an input stage circuit, which provides an internal reference current according to a reference voltage established by a reference current of the sense amplifier. What is even worse is that the reference voltage is shared by a number of sense amplifiers and the variation of the reference voltage caused by the feed through effect taking place in those sense amplifiers will be accumulated and sense results provided by those sense amplifiers will be wrongly determined. Thus, there is a prominent direction for this industry to design a sense amplifier capable of reducing the variation of the reference voltage and sensing the storage data correctly.

SUMMARY OF THE INVENTION

The invention is directed to a sense amplifier that employs a shielding circuit on an output node of a reference input stage circuit of the sense amplifier to effectively reduce variations in a reference voltage due to a feed through effect between the output node and an input node of the memory input stage circuit. The reference voltage on the input node is established by a reference current provided by a reference cell and is applied to the sense amplifier to generate a sense result corresponding to storage data stored in a read memory cell. Consequently, in comparison with the conventional sense amplifier, the sense amplifier according to the invention can effectively reduce the variations in the reference voltage and can sense the storage data stored in the memory cell correctly.

According to the present invention, a sense amplifier is provided for comparing a cell current and a reference current. The sense amplifier comprises a memory input stage circuit, a reference input stage circuit, an output stage circuit, and a shielding circuit. The memory input stage circuit has first input node receiving first sense voltage established by the cell current, and first output node outputting second sense voltage to a sense node in response to the first sense voltage. The reference input stage circuit has second input node receiving first reference voltage established by the reference current, and second output node outputting a second reference voltage to a reference node in response to the first reference voltage. The output stage circuit obtains a sense result in response to the second reference voltage and the second sense voltage. The first shielding circuit is provided in one of a location between the second output node and the reference node and shields the second output node from the reference node and a location between the first output node and the sense node for shielding the first output node from the sense node.

The invention will become apparent from the following detailed description of the preferred but non-limiting embodiments. The following description is made with reference to the accompanying drawings.

DETAILED DESCRIPTION OF THE INVENTION

The sense amplifier according to an embodiment of this invention applies a shielding circuit for reducing a reference voltage established by a reference cell from being changed severely.

Figure 1:
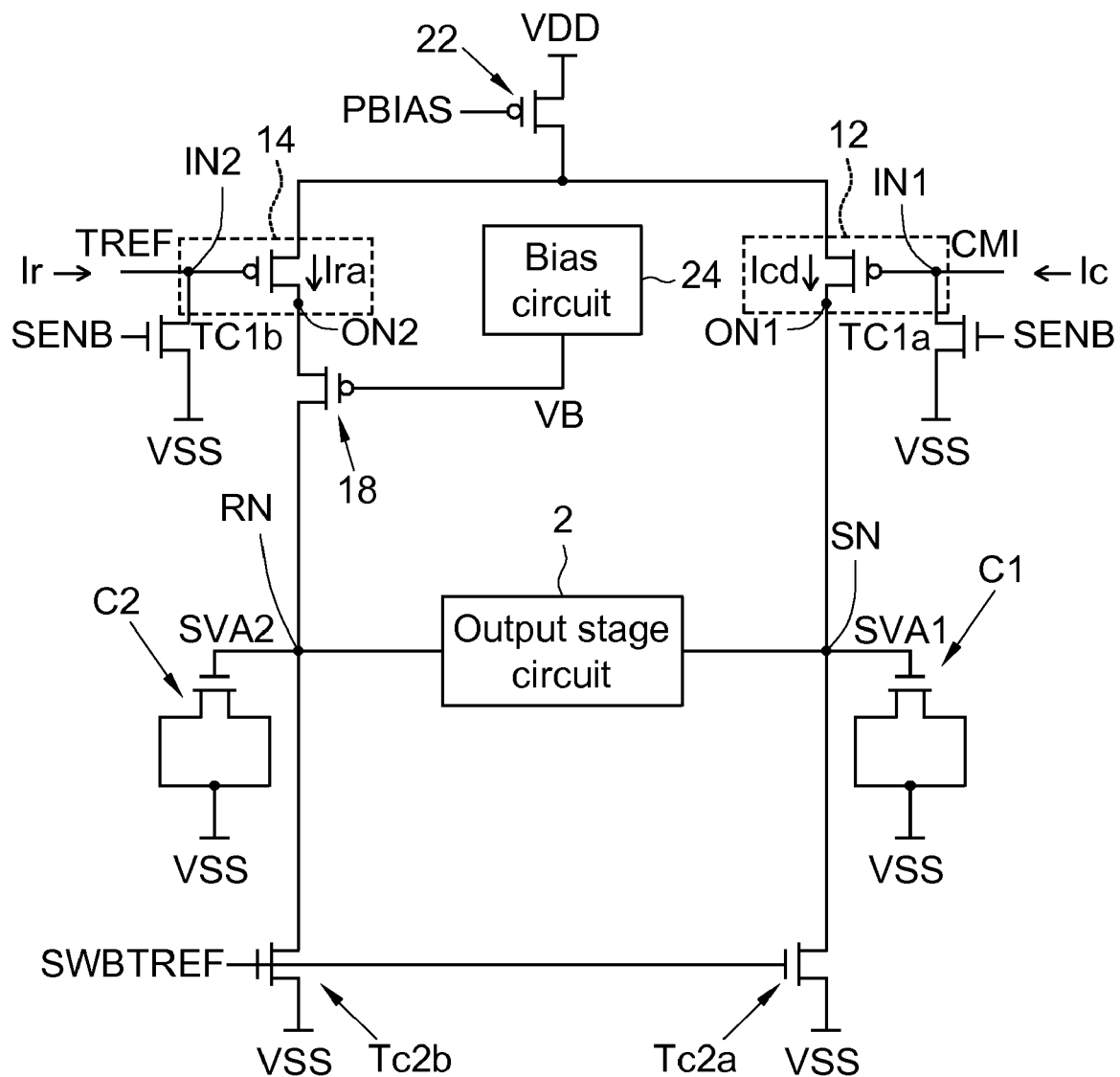
FIG. 1 illustrates a block diagram of the sense amplifier according to a first embodiment of the invention.

FIG. 1 shows a block diagram of the sense amplifier according to a first embodiment of this invention. The sense amplifier 1 is applied in a memory, which includes a memory array and a reference array (not shown). The sense amplifier 1 compares a cell current Ic provided by a memory cell of the memory array and a reference current Ir provided by the reference array, so as to sense a bit of data stored in the memory cell.

The sense amplifier 1 includes a sense node SN, a reference node RN, a memory input stage circuit 12, a reference input stage circuit 14, a first shielding circuit 18 and an output stage circuit 2.

The memory input stage circuit 12 includes a first input node IN1 and a first output node ON1. The first input node IN1 maintains a sense voltage CMI established by the cell current Ic. For example, the memory input stage circuit includes a P-type metal oxide semiconductor (PMOS) transistor having a gate (i.e. the first input node IN1) receiving the sense voltage CMI, a source coupled to a bias circuit 22, and a drain (i.e. the first output node ON1) coupled to the sense node SN. The memory input stage circuit 12 provides a cell current Icd to the sense node SN to establish a sense voltage SVA1 on the sense node SN in response to the first sense voltage CMI. For example, one end of a capacitor C1 is coupled to the sense node SN and the amplified cell current Icd is applied to charge the capacitor C1 to establish the sense voltage SVA1. The other end of the capacitor C1 receives a ground voltage VSS.

The reference input stage circuit 14 includes a second input node IN2 and a second output node ON2. The second input node IN2 maintains a reference voltage TREF established by the reference current Ir. For example, the reference input stage circuit 14 includes a PMOS transistor having a gate (i.e. the second input node IN2) receiving the reference voltage TREF, a source coupled to the bias circuit 22, and a drain (i.e. the second output node ON2) coupled to the first shielding circuit 18. The reference input stage circuit 14 provides an amplified reference current Ira to the reference node RN to establish a reference voltage SVA2 on the reference node RN in response to the reference voltage TREF. For example, a capacitor C2 is coupled to the reference node RN and the amplified reference current Ira is applied to charge the capacitor C2 to establish the reference voltage SVA2. The other end of the capacitor C2 receives the ground voltage VSS.

The first shielding circuit 18 is provided between the reference node RN and the second output node ON2 for shielding the second output node ON2 from being interfered with the reference voltage SVA2 on the reference node RN. For example, the first shielding circuit 18 includes a PMOS transistor having a gate receiving a bias voltage VB, a source coupled to the second output node ON2, and a drain coupled to the reference node RN. The first shielding circuit 18 is turned on in response to the bias voltage VB to keep a situation status, so that the variations of the voltage at the second output Node ON2 can be reduced. As such, the feed through effect between the second output node ON2 and the second input node IN2 can be effectively reduced. Consequently, the variations in the reference voltage TREF due to the feed through effect can also be effectively reduced. The bias voltage VB is provided by a bias circuit 24.

The output stage circuit 2 obtains a sense result SO in response to the reference voltage SVA2 and the sense voltage SVA1. Thus, the sense result of the memory cell can be effectively obtained.

Figure 2:
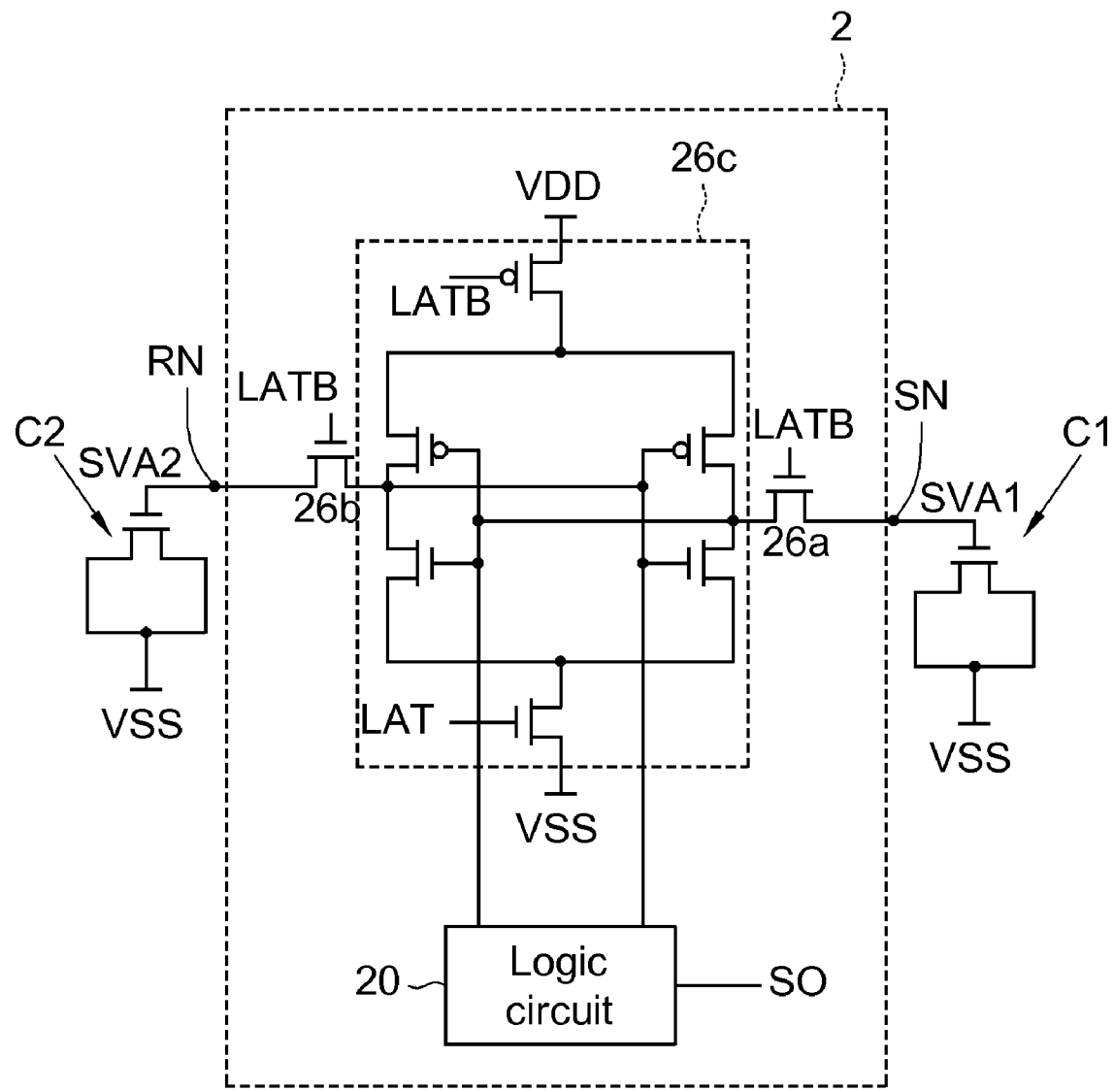
FIG. 2 illustrates a detailed block diagram of the output stage circuit 2 shown in FIG. 1.

FIG. 2 shows a detailed block diagram of the output stage circuit 2 shown in FIG. 1. In an example, the output stage circuit 2 incorporates pass gates 26a, 26b, an amplifying stage circuit, and a logic circuit 20. The pass gates 26a and 26b respectively provide the sense voltage SVA1 and the reference voltage SVA2 to the amplifying stage circuit in response to a control signal LATB. For example, the amplifying stage circuit includes a latch circuit 26c for amplifying a voltage difference VD between the sense voltage SVA1 and the reference voltage SVA2 to obtain an amplified voltage difference VDA. For example, the latch circuit 26c is enabled by a high voltage level of a control signal LAT and a low voltage level of the control signal LATB. The control signal LATB is the inverted signal of the control signal LAT. The logic circuit 20 generates the sense result SO in response to the amplified voltage difference VDA.

Figure 3:
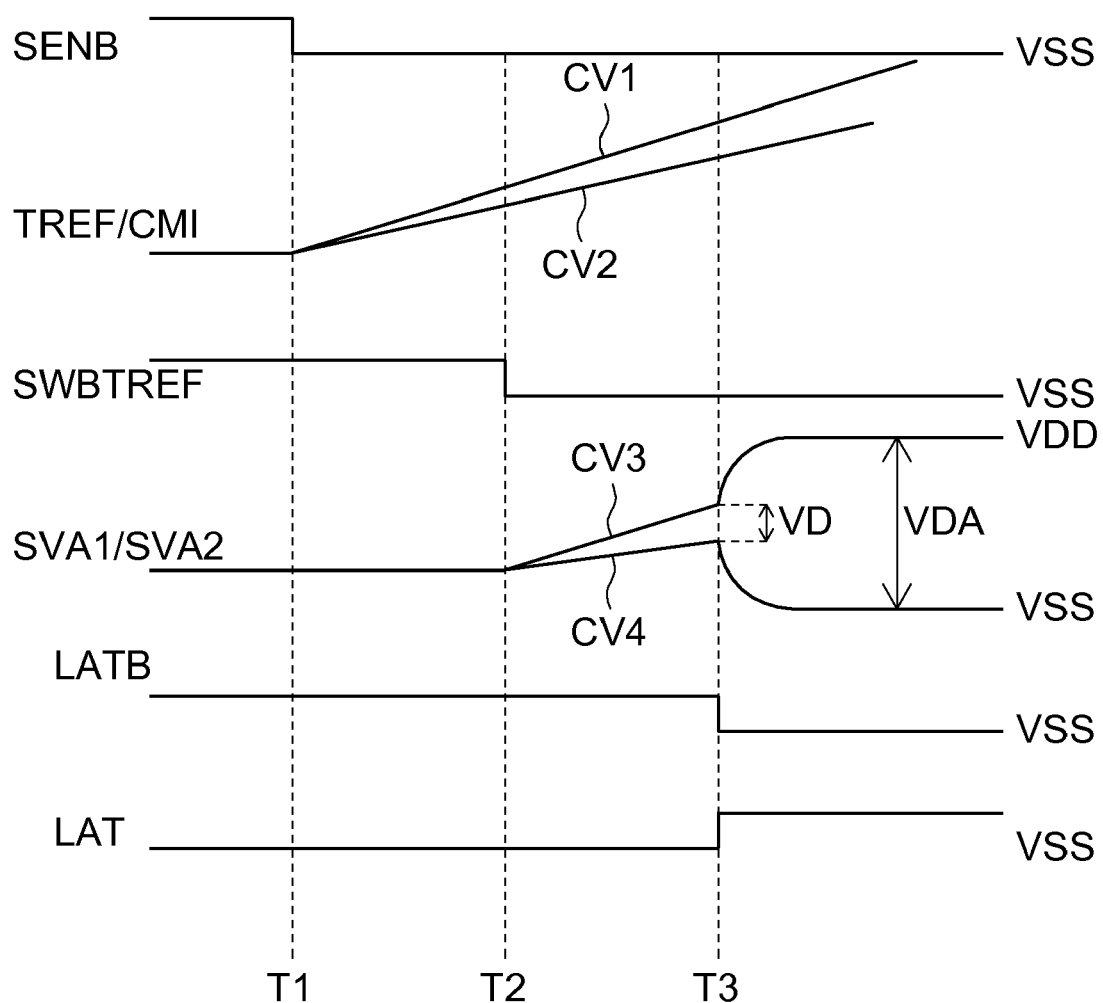
FIG. 3 illustrates a timing diagram of the related signals of the sense amplifier 1 shown in FIG. 1.

FIG. 3 shows a timing diagram of the related signals of the sense amplifier 1 shown in FIG. 1. For example, the sense amplifier 1 further includes timing controllers TC1a, TC1b, TC2a, and TC2b for managing the operation of the sense amplifier 1.

The timing controllers TC1a and TC1b enable circuit paths respectively pulling the level of the sense voltage CMI and the reference voltage TREF down to the ground voltage VSS before a time spot T1 and disable them after the time spot T1. Thus, the sense voltage CMI and the reference voltage TREF, which are respectively charged by the cell current Ic and the reference current Ir, rise from the ground voltage VSS with different grades after the time spot T1. For example, in FIG. 3, curves CV1 and CV2 indicate the level of the sense voltage CMI and the reference voltage TREF, respectively. For example, each of the timing controllers TC1a and TC1b includes an N-type MOS (NMOS) transistor, which turns on before the time spot T1 and turns off after the time spot T1 in response to a timing signal SENB. The timing signal SENB has a falling edge triggered at the time spot T1.

The timing controllers TC2a and TC2b enable circuit paths respectively to pull the level of the sense voltage SVA1 and the reference voltage SVA2 down to the ground voltage VSS before a time spot T2, and disable them after the time spot T2. Thus, the sense voltage SVA1 and the reference voltage SVA2, which are respectively charged by the amplified cell current Icd and the amplified reference current Ira, rise from the ground voltage VSS with different slopes after the time spot T2. For example, in FIG. 3, the level of the sense voltage SVA1 is indicated by the curve CV3 and the level of the reference voltage SVA2 is indicated by the curve CV4. For example, each of the timing controllers TC2a and TC2b includes an NMOS transistor, which turns on before the time spot T2 and turns off after the time spot T2 in response to a timing signal SWBTREF. The timing signal SWBTREF has a falling edge triggered at the time spot T2.

Before a time spot T3, the control signals LAT and LATB respectively have the low voltage level and the high voltage level. Thus, the latch circuit 26c is disabled and the pass gates 26a and 26b are turned on. After the time spot T3, the control signal LAT goes from a low voltage level to a high voltage level and the inverted control signal LATB goes from a high voltage level to a low voltage level. Thus, the pass gates 26a and 26b are turned off and the latch circuit 26c is enabled to amplify the voltage difference VD to obtain an amplified voltage difference VDA.

Figure 4:
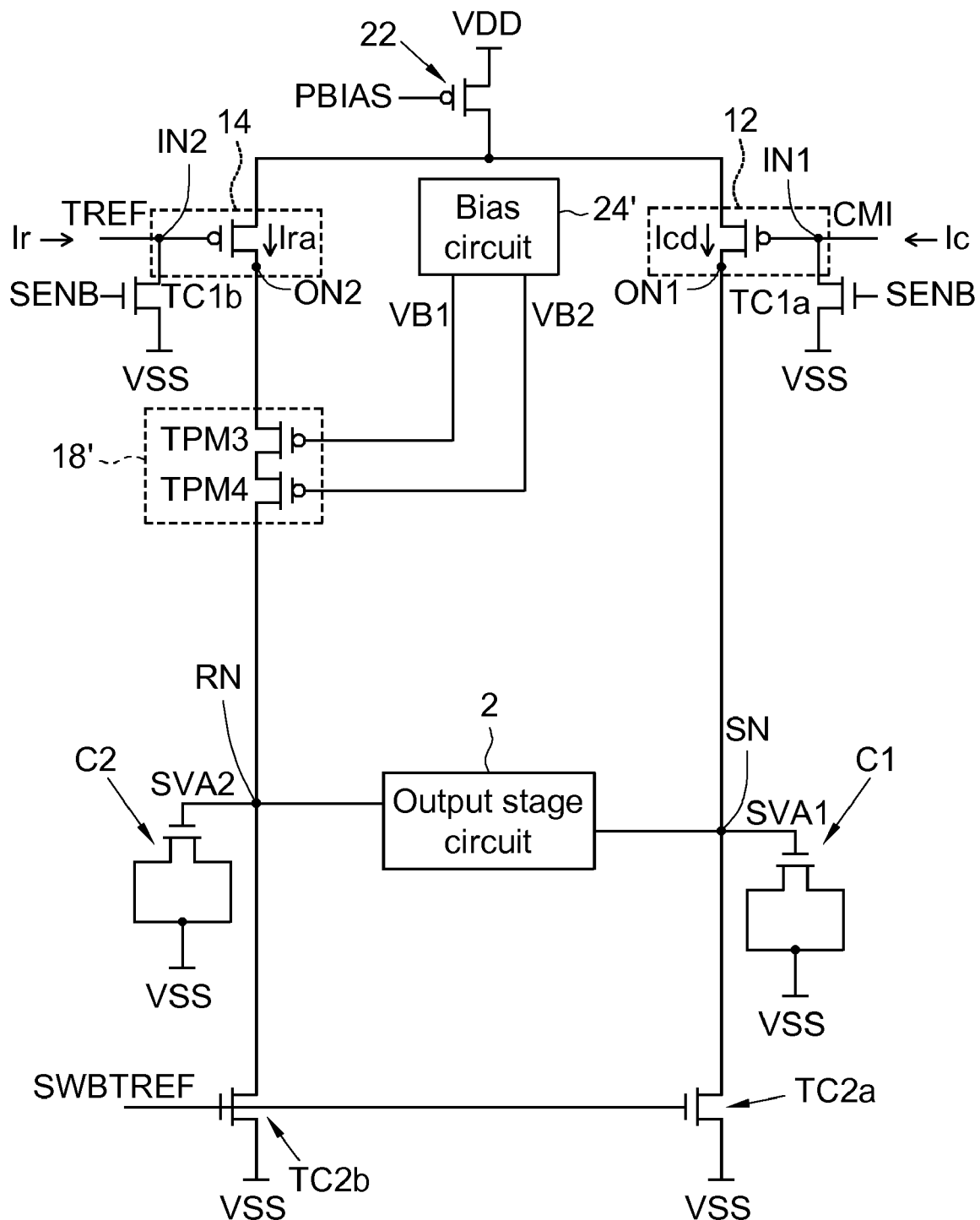
FIG. 4 illustrates a block diagram of the sense amplifier according to a second embodiment of the invention.

In the above embodiment, the first shielding circuit 18 includes a PMOS transistor. However, the first shielding circuit 18 is not limited thereto. In other embodiments, a first shielding circuit can include two or more than two transistors. For example, in FIG. 4, the first shielding circuit 18' includes PMOS transistors TPM3 and TPM4. The bias circuit 24' applied in the sense amplifier 1' provides a bias voltage VB1 to turn on the PMOS transistor TPM3 and provides a bias voltage VB2 to turn on the PMOS transistor TPM4. It can be obtained that the first shielding circuit 18' can perform the operation similar to that of the first shielding circuit 18.

Figure 5:
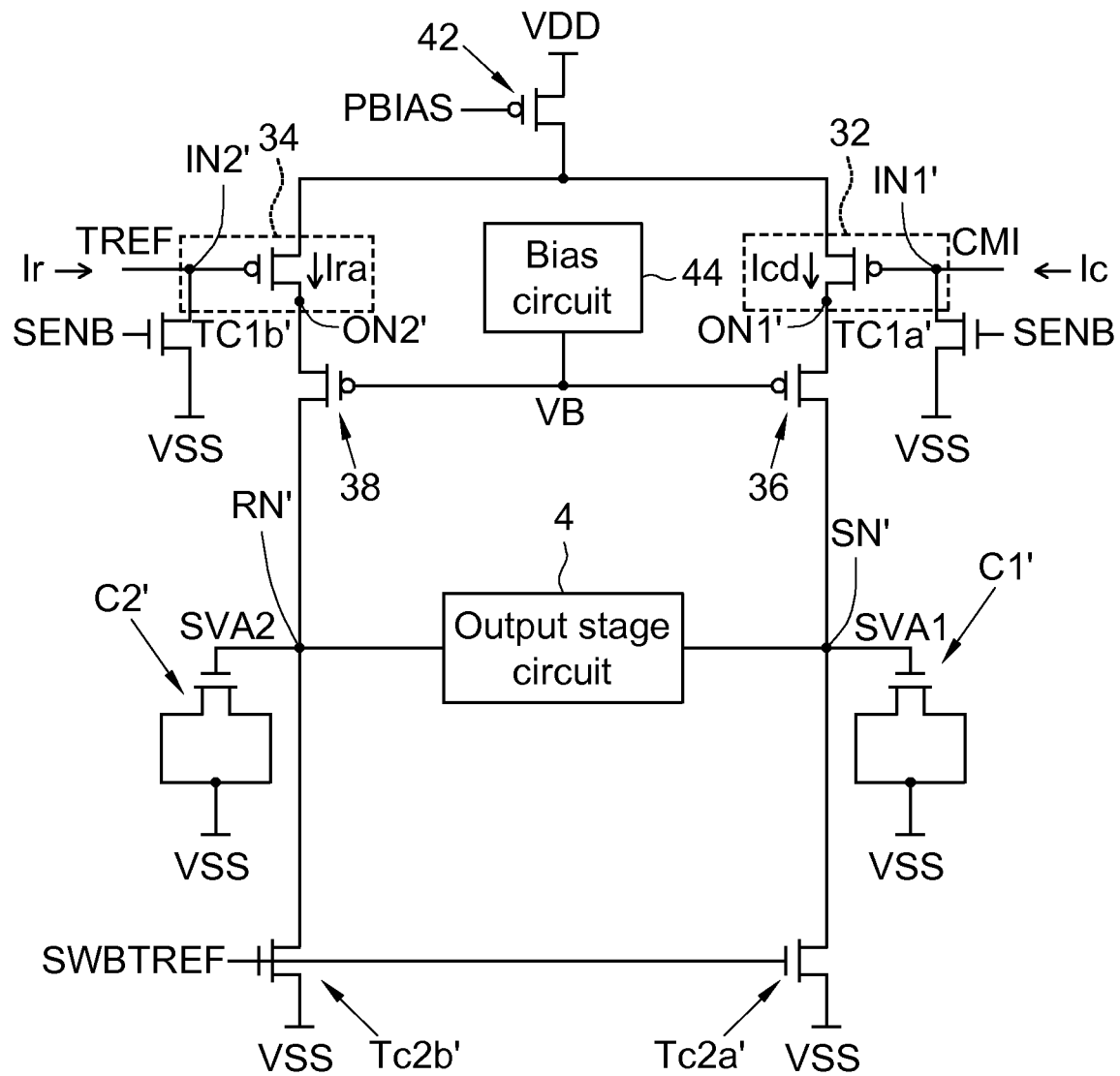
FIG. 5 illustrates a block diagram of the sense amplifier according to a third embodiment of the invention.

In the above embodiment, a first shielding circuit is incorporated in the sense amplifier to reduce the variations on the reference voltage TREF due to the feed through effect taking place on the reference input stage circuit 14. However, the sense amplifier according to the present embodiment of this invention is not limited thereto. In other example, second shielding circuits 36 and 36' can also be employed to reduce the feed through effect taking place on the memory input stage circuit, as shown in FIGS. 5-6.

A second shielding circuit 36 is provided between the sense node SN' and the first output node ON1' for shielding the first output node ON1' from being interfered with the sense voltage SVA1 on the sense node SN'. For example, the second shielding circuit 36 includes a PMOS transistor having a gate receiving the bias voltage VB, a source coupled to the first output node ON1', and a drain coupled to the sense node SN', as shown in FIG. 5.

The PMOS transistor in the second shielding circuit 36 is turned on in response to the bias voltage VB to substantially reducing variations in the voltage at the first output node ON1'. As such, the feed through effect between the first output node ON1' and the first input node IN1' can be effectively reduced. Consequently, the variations in the sense voltage CMI due to the feed through effect can also be effectively reduced.

Figure 6:
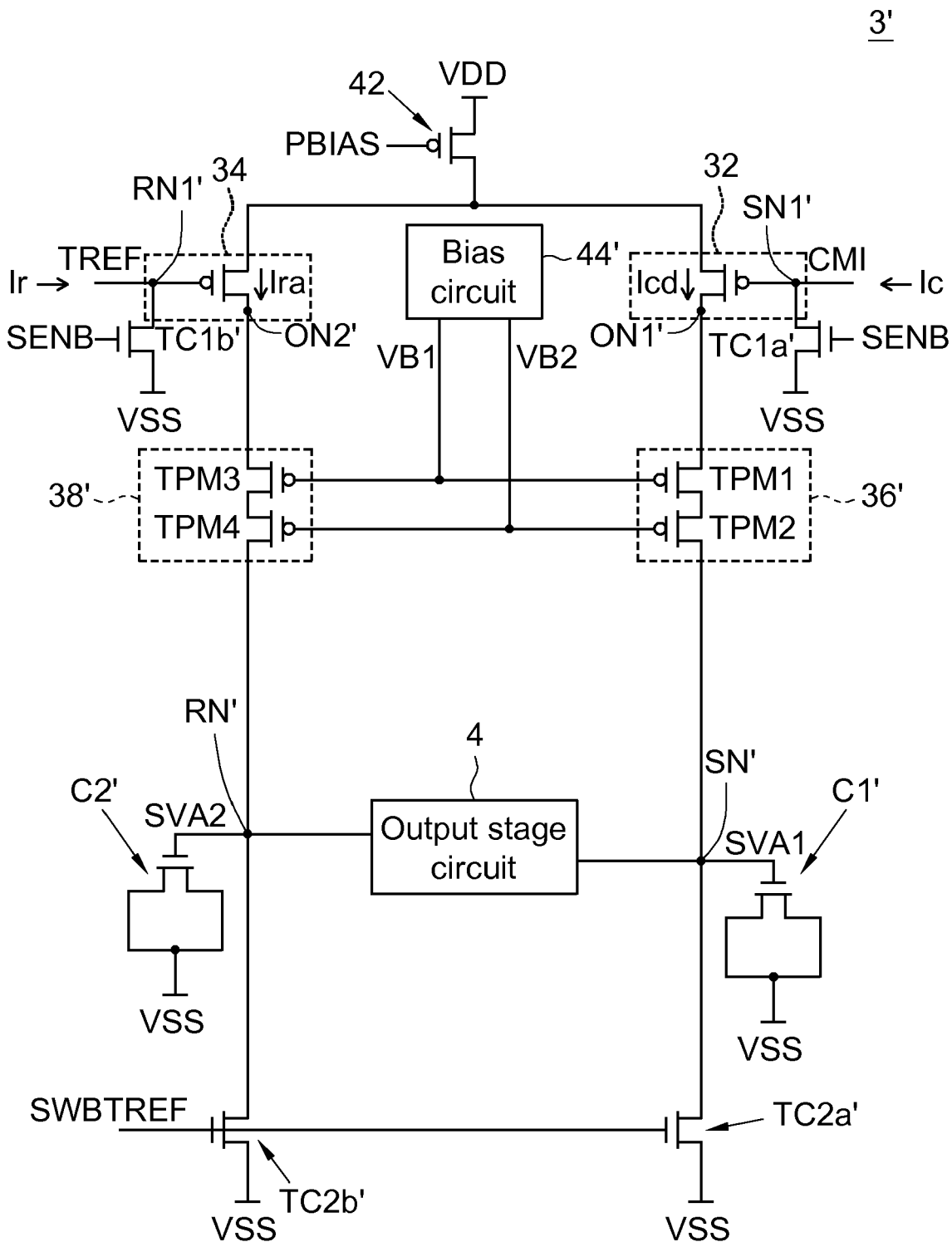
FIG. 6 illustrates a block diagram of the sense amplifier according to a fourth embodiment of the invention.

In other example, the second shielding circuit can also include two PMOS transistors TPM1 and TPM2, which are serially connected between the first output node ON1' and the sense node SN', as shown in FIG. 6.

The sense amplifier according to the embodiment of this invention employs a first shielding circuit on an output node of a reference input stage circuit to reduce variations in the voltage at an output node of the reference input stage circuit to reduce the feed through effect between the output node and the input node of the reference input stage circuit. A reference voltage on the input node of the reference input stage circuit is established by a reference current provided by a reference cell. The reference voltage is applied to the sense amplifier to generate a sense result corresponding to storage data stored in a read memory cell. Consequently, in comparison with the conventional sense amplifier, the sense amplifier according to the invention can effectively reduce the variations in the reference voltage and can sense the storage data stored in the memory cell correctly.

Besides, the sense amplifier according to the embodiment of this invention further employs a second shielding circuit on an output node of a memory input stage circuit to reduce variations in the voltage at an output node of the memory input stage circuit to reduce the feed through effect between the output node and the input node of the memory input stage circuit. A sense voltage on the input node of the memory input stage circuit is established by a sense current provided by the read memory cell. The sense voltage is sensed by the sense amplifier to generate the sense result corresponding to the storage data. Consequently, in comparison with the conventional sense amplifier, the sense amplifier according to the invention can effectively reduce the variations in the sense voltage and can sense the storage data stored in the memory cell correctly.

While the invention has been described by way of examples and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A sense amplifier, for comparing a cell current and a reference current, the sense amplifier comprising:
   a memory input stage circuit, comprising:
      a first transistor, having a control node receiving a first sense voltage established by the cell current, a first input node coupled to a power node, and a first output node for outputting a second sense voltage to a sense node in response to the first sense voltage;
   a reference input stage circuit, comprising:
      a second transistor, having a control node receiving a first reference voltage established by the reference current, a second input node coupled to the power node, and a second output node for outputting a second reference voltage to a reference node in response to the first reference voltage;
   an output stage circuit, obtaining a sense result in response to the second reference voltage and the second sense voltage; and
   a first shielding circuit, provided in one of a location between the second output node and the reference node for shielding the second output node from the reference node and a location between the first output node and the sense node for shielding the first output node from the sense node.

2. The sense amplifier according to claim 1, wherein the sense amplifier further comprises:
   a second shielding circuit, provided in another one of said locations.

3. The sense amplifier according to claim 2, wherein the second shielding circuit comprises:
   a transistor, comprising a control end receiving a bias voltage, a first output end coupled to the first output node, and a second output end coupled to the sense node.

4. The sense amplifier according to claim 2, wherein the second shielding circuit comprises:
   a first transistor, comprising a control end receiving a first bias voltage, a first output end coupled to the first output node, and a second output end; and
   a second transistor, comprising a control end receiving a second bias voltage, a first output end coupled to the second output end of the first transistor, and a second output end coupled the sense node.

5. The sense amplifier according to claim 1, wherein the first shielding circuit comprises:
   a transistor, comprising a control end receiving a bias voltage, a first output end coupled to the second output node, and a second output end coupled to the reference node.

6. The sense amplifier according to claim 1, wherein the first shielding circuit comprises:
   a first transistor, comprising a control end receiving a first bias voltage, a first output end coupled to the second output node, and a second output end; and
   a second transistor, comprising a control end receiving a second bias voltage, a first output end coupled to the second output end of the first transistor, and a second output end coupled the reference node.

7. The sense amplifier according to claim 1, wherein the output stage circuit comprises:
   an amplifying stage circuit, for amplifying a voltage difference between the second sense voltage and the second reference voltage to obtain an amplified voltage difference.

8. The sense amplifier according to claim 7, wherein the output stage circuit comprises:
   a logic circuit, for generating the sense result in response to the amplified voltage difference.

9. A sense amplifier, for comparing a cell current and a reference current, the sense amplifier comprising:
   a memory input stage circuit, comprising:
      a first transistor, having a control node receiving a first sense voltage established by the cell current, a first input node coupled to a power node, and a first output node for outputting a second sense voltage to a sense node in response to the first sense voltage;
   a reference input stage circuit, comprising:
      a second transistor, having a control node receiving a first reference voltage established by the reference current, a second input node coupled to the power node, and a second output node for outputting a second reference voltage to a reference node in response to the first reference voltage;
   an output stage circuit, obtaining a sense result in response to the second reference voltage and the second sense voltage;
   a first shielding circuit, provided in one of a location between the second output node and the reference node for shielding the second output node from the reference node and a location between the first output node and the sense node for shielding the first output node from the sense node; and
   a second shielding circuit, provided in another one of said locations, wherein the second shielding circuit comprises:
      a first transistor, comprising a control end receiving a first bias voltage, a first output end coupled to the first output node, and a second output end; and
      a second transistor, comprising a control end receiving a second bias voltage, a first output end coupled to the second output end of the first transistor, and a second output end coupled the sense node.

10. The sense amplifier according to claim 9, wherein the first shielding circuit comprises:
a transistor, comprising a control end receiving a bias voltage, a first output end coupled to the second output node, and a second output end coupled to the reference node.

11. The sense amplifier according to claim 9, wherein the first shielding circuit comprises:
a first transistor, comprising a control end receiving a first bias voltage, a first output end coupled to the second output node, and a second output end; and
a second transistor, comprising a control end receiving a second bias voltage, a first output end coupled to the second output end of the first transistor, and a second output end coupled the reference node.

12. The sense amplifier according to claim 9, wherein the output stage circuit comprises:
an amplifying stage circuit, for amplifying a voltage difference between the second sense voltage and the second reference voltage to obtain an amplified voltage difference.

13. The sense amplifier according to claim 12, wherein the output stage circuit comprises:
a logic circuit, for generating the sense result in response to the amplified voltage difference.

14. A sense amplifier, for comparing a cell current and a reference current, the sense amplifier comprising:
a memory input stage circuit, comprising:
a first transistor, having a control node receiving a first sense voltage established by the cell current, a first input node coupled to a power node, and a first output node for outputting a second sense voltage to a sense node in response to the first sense voltage;
a reference input stage circuit, comprising:
a second transistor, having a control node receiving a first reference voltage established by the reference current, a second input node coupled to the power node, and a second output node for outputting a second reference voltage to a reference node in response to the first reference voltage;
an output stage circuit, obtaining a sense result in response to the second reference voltage and the second sense voltage; and
a first shielding circuit, provided in one of a location between the second output node and the reference node for shielding the second output node from the reference node and a location between the first output node and the sense node for shielding the first output node from the sense node, wherein the first shielding circuit comprises:
a first transistor, comprising a control end receiving a first bias voltage, a first output end coupled to the second output node, and a second output end; and
a second transistor, comprising a control end receiving a second bias voltage, a first output end coupled to the second output end of the first transistor, and a second output end coupled the reference node.

15. The sense amplifier according to claim 14, wherein the sense amplifier further comprises:
a second shielding circuit, provided in another one of said locations.

16. The sense amplifier according to claim 15, wherein the second shielding circuit comprises:
a transistor, comprising a control end receiving a bias voltage, a first output end coupled to the first output node, and a second output end coupled to the sense node.

17. The sense amplifier according to claim 15, wherein the second shielding circuit comprises:
a first transistor, comprising a control end receiving a first bias voltage, a first output end coupled to the first output node, and a second output end; and
a second transistor, comprising a control end receiving a second bias voltage, a first output end coupled to the second output end of the first transistor, and a second output end coupled the sense node.

18. The sense amplifier according to claim 14, wherein the output stage circuit comprises:
an amplifying stage circuit, for amplifying a voltage difference between the second sense voltage and the second reference voltage to obtain an amplified voltage difference.

19. The sense amplifier according to claim 18, wherein the output stage circuit comprises:
a logic circuit, for generating the sense result in response to the amplified voltage difference.

* * * * *